( 12 ) United States Patent
Zacherl et al.

(10) Patent No.: US 10,842,030 B2
(45) Date of Patent: Nov. 17, 2020

(54) METHOD FOR THROUGH-PLATING A PRINTED CIRCUIT BOARD AND SUCH A PRINTED CIRCUIT BOARD

(71) Applicant: Vitesco Technologies GmbH, Hannover (DE)

(72) Inventors: Jürgen Zacherl, Donaustauf (DE); Erich Mattmann, Heidesheim (DE); Waldemar Brinkis, Nidderau (DE)

(73) Assignee: VITESCO TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 16/636,753

(22) PCT Filed: Jul. 6, 2018

(86) PCT No.: PCT/EP2018/068339
§ 371 (c)(1),
(2) Date: Feb. 5, 2020

(87) PCT Pub. No.: WO2019/029920
PCT Pub. Date: Feb. 14, 2019

(65) Prior Publication Data
US 2020/0170123 A1 May 28, 2020

(30) Foreign Application Priority Data
Aug. 8, 2017 (DE) .......... 10 2017 213 838

(51) Int. Cl.
*H05K 1/02* (2006.01)
*H05K 1/09* (2006.01)
(Continued)

(52) U.S. Cl.
CPC ......... *H05K 3/4061* (2013.01); *H05K 1/0306* (2013.01); *H05K 1/115* (2013.01);
(Continued)

(58) Field of Classification Search
CPC .. H05K 1/02; H05K 1/09; H05K 3/10; H05K 3/12; H05K 3/20; H05K 3/28;
(Continued)

(56) References Cited

U.S. PATENT DOCUMENTS 5,807,610 A * 9/1998 Cox ............... H05K 3/1225
427/256
6,002,951 A * 12/1999 Goland ............ H01L 21/4857
257/E23.076
(Continued)

FOREIGN PATENT DOCUMENTS

DE 69431866 8/2003
DE 69930719 8/2006
(Continued)

OTHER PUBLICATIONS

Office Action for the corresponding German Patent Application No. 10 2017 213 838.6.
(Continued)

*Primary Examiner* — Xiaoliang Chen
(74) *Attorney, Agent, or Firm* — Cozen O'Connor

(57) ABSTRACT

A method of through-plating a circuit board having conductors formed on two sides. At least two holes are filled under compression pressure with a sintering paste. Subsequently, the sintering paste is dried and fired to form a cohesive bond with the ceramic substrate and fill the holes. Simultaneous filling of multiple holes having different hole diameters is accomplished using a printing screen with screen holes of different diameters. A single print parameter set is used. The printing screen here has at least one screen hole for filling a hole larger than the reference hole. The screen hole has an area-reducing and area-dividing geometry that divides the screen hole into at least two hole sections.

18 Claims, 4 Drawing Sheets

(51) Int. Cl.
*H05K 3/10* (2006.01)
*H05K 3/12* (2006.01)
*H05K 3/20* (2006.01)
*H05K 3/28* (2006.01)
*H01L 21/02* (2006.01)
*H01L 21/48* (2006.01)
*H01L 21/66* (2006.01)
*H01L 23/48* (2006.01)
*H01L 23/52* (2006.01)
*H01L 23/538* (2006.01)
*H01L 23/498* (2006.01)
*H05K 3/40* (2006.01)
*H05K 1/03* (2006.01)
*H05K 1/11* (2006.01)

(52) U.S. Cl.
CPC .............. *H05K 2201/09727* (2013.01); *H05K 2203/0139* (2013.01); *H05K 2203/1131* (2013.01)

(58) Field of Classification Search
CPC ......... H01L 21/02; H01L 21/48; H01L 21/66; H01L 23/48; H01L 23/52; H01L 23/538; H01L 23/498
USPC ....... 174/264, 258; 427/79, 97.1, 97.7, 98.4, 427/256, 282; 428/209, 620, 621; 29/428, 831, 833, 846
See application file for complete search history.

(56) References Cited

U.S. PATENT DOCUMENTS

| | | | | |
|---|---|---|---|---|
| 6,194,085 | B1* | 2/2001 | Fasano | H01L 22/24 257/E21.527 |
| 2003/0111518 | A1* | 6/2003 | Dances | B23K 3/0638 228/215 |
| 2006/0237516 | A1* | 10/2006 | Leon | H05K 3/3484 228/180.22 |
| 2009/0025215 | A1* | 1/2009 | Murakami | G02F 1/136227 29/846 |
| 2012/0107489 | A1* | 5/2012 | Harkins | B05C 5/02 427/97.7 |

FOREIGN PATENT DOCUMENTS

| | | |
|---|---|---|
| DE | 102014106636 | 11/2015 |
| EP | 2292440 | 3/2011 |
| EP | 2421343 | 2/2012 |
| JP | H01189196 | 7/1989 |

OTHER PUBLICATIONS

IBM Technical Disclosure Bulletin, "Screen Mask for Through-Hole Printing", vol. 33 No. 5, pp. 104-108, Oct. 1990.

\* cited by examiner

METHOD FOR THROUGH-PLATING A PRINTED CIRCUIT BOARD AND SUCH A PRINTED CIRCUIT BOARD

CROSS REFERENCE TO RELATED APPLICATIONS

This is a U.S. national stage of Application No. PCT/EP2018/068339 filed Jul. 6, 2018. Priority is claimed on German Application No. DE 10 2017 213 838.6 filed Aug. 8, 2017 the content of which is incorporated herein by reference.

BACKGROUND OF THE INVENTION

1. Field of the Invention

The present invention relates to a method of through-plating a printed circuit board and to a printed circuit board, especially for use in sensors for motor vehicles.

2. Description of Related Art

According to the prior art, printed circuit boards functioning as circuit carriers on two sides are known. Such printed circuit boards can have, for example, a sintered ceramic as a carrier material for conductor tracks. Furthermore, such printed circuit boards can have metallized holes that interconnect the conductor tracks formed on the two sides of the circuit carrier.

Such a printed circuit board can be found, for example, in what is called a MAgnetic Passive Position Sensor, also termed MAPPS, which is used in a fuel tank of a motor vehicle for fuel fill level detection. Such a sensor contains a printed circuit board having a circuit carrier consisting of a sintered ceramic substrate and provided on one side with conductor tracks and a contact spring structure, wherein the contact spring structure interacts with the conductor tracks. Depending on the fuel fill level of the tank, this contact spring structure is contacted with the conductor tracks by a magnet. This sintered ceramic substrate further comprises, for example, two metallized holes to interconnect the conductor tracks on both sides of the sintered ceramic substrate.

To metallize these holes, a layer of an electrically conductive thick-layer paste or sintering paste is first deposited on one side of the sintered ceramic substrate in the region of the holes. This paste is then partly drawn into the holes from the other side by a negative pressure. The ceramic substrate is then dried and fired in a sintering furnace, with the result that the thick-layer paste or sintering paste fully sinters and enters into a cohesive bond with the ceramic substrate. An analogous procedure to this is then carried out with respect to the other side of the ceramic substrate. The outcome is that a first layer and a second layer of a respectively electrically conductive thick-layer paste thus partly overlap in the holes, thereby giving rise to through-plating. Metallization therefore fundamentally comprises a filling operation and a subsequent thermal treatment operation.

The holes are finally closed by a glass compound so that the side of the ceramic substrate that is equipped with the conductor tracks and the contact spring structure can be encapsulated in a liquid-tight or hermetic manner.

SUMMARY OF THE INVENTION

It is an object of one aspect of the present invention to improve such through-plating. It is a further object of the present invention to improve the manufacturing process underlying this through-plating.

One aspect of the invention is a method of through-plating a printed circuit board with conductor tracks formed on two sides of a sintered ceramic substrate, in which a multitude of holes in the ceramic substrate of different hole diameters are filled simultaneously under compression pressure with a metallic sintering paste in a single filling manufacturing operation. The sintering paste is subsequently dried and fired. The firing fully sinters the sintering paste, and the sintering paste in the fully sintered state enters into at least a cohesive bond with the ceramic substrate and fills the hole, preferably completely.

According to whether the filling of the hole with the sintering paste forms an excess of material or a material plug which engages behind the respective ceramic substrate side or the respective hole edge, a form fit between the ceramic substrate and the sintering paste may also arise. Such a plug may be a material excess with respect to the respective substrate side of about 2 to 5 μm. According to the size of the diameter of the substrate hole to be filled, the material excess may also, for example, be within an order of magnitude of about 30 to 50 μm.

For simultaneous filling of multiple holes having different hole diameters with the sintering paste, a printing screen having a multitude of assigned screen holes of different diameter is used, with use of a single set of print parameters fixed on the basis of one hole among those to be filled that functions as a reference.

This printing screen has at least one screen hole for filling of a larger hole compared to the reference hole, and the screen hole has an area-reducing and area-dividing geometry that divides the screen hole into at least two hole sections.

The proposed method allows the filling manufacturing operations required for through-plating of such a printed circuit board to be reduced to a minimum. Without such a proposed specific printing screen, a ceramic substrate comprising multiple holes of different diameter may require a number of filling manufacturing operations corresponding to the number of different hole diameters. The printing screen allows such a multistage filling manufacturing operation advantageously to be reduced even to a single filling manufacturing operation or at least to very few filling manufacturing operations.

This has the advantage that troublesome, already fully sintered material excesses that have formed in the filling of holes of a particular diameter size can be avoided in the filling of other holes of a different diameter size. This is because such material excesses complicate the filling manufacturing operation.

The method proposed is also material- and hence cost-saving because, by contrast with the prior art, it enables filling of the holes as required—depending on the current-bearing capacity of the through-plating required in each case. This is because the filling operation can distinguish between smaller holes for connection of signal wires and larger holes for connection of wires that transmit higher powers.

By avoiding separate filling manufacturing operations based on hole diameter, the migration of the metal from the aforementioned conductor tracks and of the sintering paste and possibly other constituents of the conductor tracks and the sintering paste is also counteracted because there are no thermal treatment operations on the printed circuit board that follow the individual filling manufacturing operations for drying and firing of the sintering paste in the individual holes. Instead, the number of thermal treatment operations is reduced to a minimum.

A printed circuit board or board or circuit board within the context of this application is understood to mean a printed circuit board having a carrier material or substrate suitable for a high-temperature or sintering process, i.e. for a treatment at about 950° C. or else at about 1500° C. In the case of an alumina ceramic used for the carrier material, temperatures of up to about 950° C. are possible, up to which such a material is processible.

The conductor tracks can be applied to or deposited on the carrier material or substrate by printing in a screen printing method or stencil printing method. A ceramic substrate carrier printed in such a way is fired. The conductor tracks fuse or fully sinter to form very resistant and reliable layers. In principle, such a firing operation can be effected by what is called the thick-layer technique.

Sintering or full sintering is understood here to mean solidification and consolidation of a sintering paste to form a compact material as a result of a thermal treatment in a sintering furnace.

The ceramic substrate carrier to be through-plated according to one aspect of this invention has already been fully sintered before its at least two holes are filled with the sintering paste.

The filling operation according to one aspect of the invention can be fundamentally distinguished from the filling of VIAs or VIA filling known from the prior art (VIA hole filling; VIA=Vertical Interconnect Access). The filling of VIAs or VIA filling is understood to mean filling of a hole of a green body—also termed "green tape" or sintering film—in screen printing or stencil printing for the purpose of through-plating.

Such a green body ("green tape") here consists of a layer of a dry but unsintered sintering compound or film, for instance consisting of an alumina ceramic, which is consolidated and solidified to form a solid carrier material in a drying operation and in a firing operation in a sintering furnace. During the production, such a green body layer is applied to a plastic carrier film and wound up into a roll.

Such a green body layer or sintering paste layer may have a thickness of about 0.1 mm in the dried but unsintered state. Two or more such layers of sintering pastes consisting of alumina ceramic can be stacked one on top of another depending on the application. Each layer of such a stack of layers here may have conductor tracks, resistors and at least one hole for the through-plating of the layer. Such holes are filled here with a thick layer (cf. aforementioned VIA filling) in screen printing or stencil printing. In other words, these holes have already been filled before the stack is compressed. Such a stack is then isostatically pressed, but not for instance in order to fill or completely fill the holes, but rather in order to compress the stack. Such a compressed stack of individual green body layers is finally fully sintered in a furnace, or formed to give a consolidated and solidified sintered ceramic as a result of the drying and the firing operation in the furnace.

Sintering in connection with the through-plating in the context of this application is understood to mean an operation in which a pasty mixture—for instance consisting of a metal or precious metal, a glass, a resin and a thinner—for use as a conducting paste or sintering paste that functions as filler gives rise to a physically solid and electrically conductive structure.

The proposed metallization of the holes assures failsafe through-plating of the substrate because sufficient electrically conductive material is present at every point in the respective hole.

Furthermore, such a metallization requires a smaller area around the respective hole that has to be metallized for the purpose of the through-plating. Reference is also made here to an advantageous miniaturization of the metallized holes.

The metal-containing sintering paste used as filler, especially silver-palladium sintering paste, has a palladium content here of at least 5%, preferably 10% to 15%. The palladium here is an important constituent part of the paste composition since it increases the bond strength of the sintering paste in the hole of the sintered ceramic substrate. Such a hole is drilled by a laser. Vitrification forms on the surface of the hole and makes it difficult for the sintering paste to bond. The addition of palladium substantially improves the bonding mechanism when the sintering paste is pressed into the hole.

The palladium content in the sintering paste additionally brings about better compatibility with a metallic sintering paste, which functions as a conductor track and is subsequently printed on by screen printing or stencil printing in the region of the completely filled hole, in that the palladium attenuates or even eliminates the Kirkendall effect which is known as such to a person skilled in the art.

The Kirkendall effect is characterized in that, given a sufficiently high temperature with two adjoining solid phases, the volume of the one phase decreases, whereas the volume of the other phase increases. The effect is particularly readily noticeable if the phase boundary has been previously marked since a displacement of the marking relative to an outer sample geometry is then observed. The phase boundary does not migrate itself, but material between the phases and hence the position of the phase boundary relative to the outer sample geometry moves.

The metal-containing sintering paste here may be lead-containing or lead-free depending on what requirements are placed on the sintering paste.

A print parameter set—which as such is dependent on the diameter of a substrate hole to be filled or through-plated—in the context of this disclosure is especially understood here to mean: a squeegee fill pressure, a squeegee offset pressure and a squeegee speed. The squeegee fill pressure or compression pressure is the pressure that is built up or arises when the sintering paste is compressed within a printing tool in the form of a printing squeegee. The squeegee offset pressure, by contrast, is the pressure with which the printing squeegee is set onto a printing screen for filling of the holes of the ceramic substrate. The squeegee fill pressure or compression pressure should accordingly be distinguished from the squeegee offset pressure, and may vary depending on the diameter of the substrate hole and the substrate thickness. A print squeegee is understood to mean a mobile printing tool in which, by means of a mobile component, a sintering paste to be compressed is introduced under a squeegee fill pressure or compression pressure of 1 to 4 bar into a hole or into the holes of the printing screen and into a hole or into the holes of the ceramic substrate. The squeegee speed is the speed with which the print squeegee moves across the printing screen.

In connection with the at least one screen hole, an area-reducing and area-dividing geometry is understood to mean a geometry that divides the assigned screen hole into at least two hole sections or hole segments in order to be able to simultaneously fill at least multiple holes having different hole diameters and ideally even all holes to be filled in the ceramic substrate with the sintering paste by means of a single print parameter set which is fixed on the basis of one of the holes to be filled that functions as reference.

This geometry is based on the consideration of moving the size, in terms of area, of the individual hole sections formed by the geometry in the assigned screen hole into the region of the size, in terms of area, of the substrate hole that functions as reference, in order to guarantee the fill result achieved for the reference hole for holes in the substrate that are larger compared to the reference hole as well.

In one embodiment, the reference hole in the substrate defined for fixing the print parameter set may ideally be the hole having the smallest diameter.

In a further embodiment, all holes to be filled in the ceramic substrate may be filled simultaneously in a single filling manufacturing operation. In this case, the aforementioned troublesome effect of material excesses is actually completely absent. And by avoiding separate filling manufacturing operations, the migration of the metal, for instance of the aforementioned precious metal silver and possibly of other constituents of the sintering paste, is also counteracted to the best possible degree because there are no thermal treatment operations that follow the individual filling manufacturing operations for drying and firing of the sintering paste.

The area-reducing and area-dividing geometry of the printing screen that divides the assigned printing hole into at least two hole sections may be configured in different ways.

In one embodiment, a geometry that divides the screen hole into three hole sections is used for the assigned screen hole. It is possible here, for example, to use three identical screen sections in the form of lands arranged offset from one another by 120°, and for these to meet in the center of the screen hole, being formed onto one another at the center of the screen hole.

Additionally or alternatively, in a further embodiment, it is possible to use a geometry that divides the screen hole into four hole sections for the assigned screen hole. It is possible here, for example, to use four identical screen sections in the form of lands arranged offset from one another by 90°, and for these to meet in the center of the screen hole, being formed onto one another at the center of the screen hole.

Additionally or alternatively, in a further embodiment, it is possible to use a geometry that divides the screen hole into five hole sections for the assigned screen hole. It is possible here, for example, to use one annular screen section and four identical screen sections in the form of lands arranged offset from one another by 90°, and for these to be formed onto the annular screen section on the outer radius.

Additionally or alternatively, in a further embodiment, it is possible to use a geometry that divides the screen hole into eight hole sections for the assigned screen hole. It is possible here, for example, to use eight identical screen sections in the form of lands arranged offset from one another by 45°, and for these to meet in the center of the screen hole, being formed onto one another at the center of the screen hole.

Additionally or alternatively, in a further embodiment, it is possible to use a geometry that divides the screen hole into sixteen hole sections for the assigned screen hole. It is possible here, for example, to use one annular screen section and eight identical screen sections in the form of lands arranged offset from one another by 45°, and for these to meet in the center of the screen hole, being formed onto one another at the center of the screen hole and intersecting with the annular screen section.

In a further embodiment, a printing screen with at least one row of holes having at least one screen hole with an area-reducing and area-dividing geometry of the type described above is used.

In a further embodiment, the only print parameter set is fixed for hole diameters of 100 to 450 μm to be filled. It is possible here to fix a hole diameter of 300 to 600 μm for the assigned screen hole without taking account of the area-reducing and area-dividing geometry. For the screen it is possible here to use, for example, a screen thickness of 30 to 150 μm.

Also proposed is a printed circuit board having conductor tracks formed on two sides of a sintered ceramic substrate, wherein the ceramic substrate having at least two holes to be through-plated in a fully sintered state has been through-plated by the method described above. According to one aspect of the invention, a compression pressure of preferably about 1 to 4 bar is applied by a movable component in order to compress the sintering paste. A movable component within the context of this application is understood here to mean a plunger which, with a surrounding housing, forms a self-contained space filled with the sintering paste to be compressed. The plunger here may have an elongate extent, for instance in the form of a sword, in order to be able to simultaneously fill a plurality of holes mutually arranged in a row. In one embodiment, the compression pressure applied by the compression tool is about 3 bar.

Such a compression pressure must be applied for substrate thicknesses over and above about 0.25 mm in order to assure filling of the respective hole in the sintered ceramic substrate. In principle, the aforementioned compression pressure range is suitable for processing substrate thicknesses of about 0.25 mm to 5 mm. In one embodiment, the preferred range of substrate thicknesses is 0.5 mm to 0.7 mm.

The ceramic substrate may be fixed here on a carrier by a negative pressure, in that the ceramic substrate is drawn against the carrier via at least one suction channel formed in the carrier after said substrate has been correspondingly oriented beforehand or has been positioned with the aid of at least one stop.

The screen used additionally allows avoidance of impurities on one side of the substrate. In order also to protect the other side of the ceramic substrate from impurities, a flexible layer can be used which is arranged between the ceramic substrate and the carrier. According to one embodiment, a paper layer is used for this purpose.

The ceramic substrate here may be framed by a reinforcing frame that protects the substrate from damage as a result of being subjected to compression pressure in the filling of the holes with the sintering paste.

Finally, conductor tracks of different width and thickness can be applied using a thick layer by screen printing or stencil printing on a substrate that has been through-plated in such a way.

BRIEF DESCRIPTION OF THE DRAWINGS

The invention will be discussed in detail in the following text with reference to the illustrations in the figures. Further advantageous refinements of the invention emerge from the dependent claims and the description below of preferred embodiments. The figures show:

DETAILED DESCRIPTION OF THE PRESENTLY PREFERRED EMBODIMENTS

Figure 1:
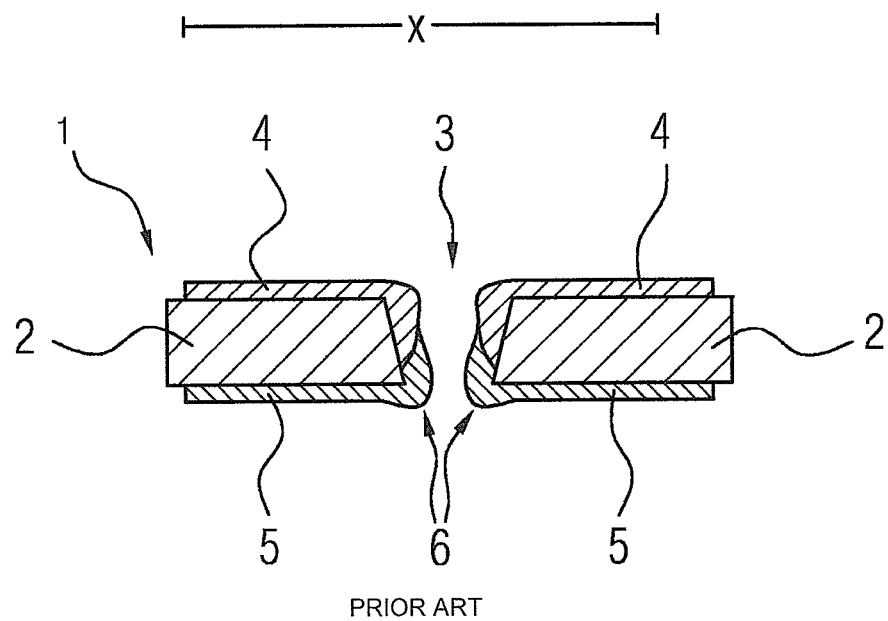
FIG. 1 is a schematic illustration of a metallization of a substrate hole according to the prior art.

FIG. 1 illustrates a substrate 2 as part of a printed circuit board 1. The substrate 2, which may have been produced from a sintered ceramic, for example an alumina ceramic, has a hole 3 and has been printed on a first side with a first electrically conductive layer 4 or thick layer 4 and on a second side, opposite the first side, with a second electrically conductive layer 5 or thick layer 5. The hole 3 here is of conical design for production-related reasons. The two thick layers 4, 5 extend partly into the hole 3 and overlap in so doing. Such a coating of the hole 3 constitutes a through-plating of the substrate 2, by which through-plating conductor tracks 4, 5 formed on the two sides of the substrate 2 are connected to one another.

Such a coating of the hole 3 is achieved in that the two thick layers 4, 5 are successively partly drawn into the hole 3 from the respective opposite side of the substrate 2 by a negative pressure. In this example, the thick layer 4 has first been drawn in and then fully sintered in a furnace. Thereafter, the thick layer 5 has been drawn in and fully sintered in the furnace.

Weak points with very small layer thicknesses may be formed here, for instance a weak point 6 at the lower of the two hole edges. Such a weak point 6, which may have a layer thickness of about 1 to 2 µm, can even lead to a failure of the through-plating under a high current load. If the hole 3 is also closed, for instance by a further printed layer or by further printed layers, or in that, for example, a glass compound is incorporated or introduced into the hole 3, because for instance one of the two substrate sides is to be hermetically closed off, such a filling of the hole 3 can lead to an excessive change in the resistance and hence also to an excessive change in the electrical behavior of the through-plating, and this change as such may be unacceptable.

Figure 2:
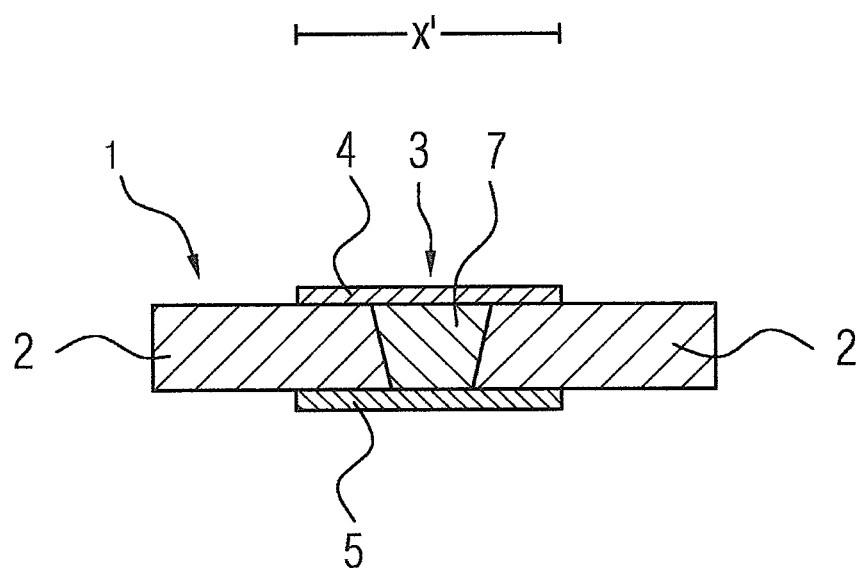
FIG. 2 is a schematic illustration of an inventive metallization of a substrate hole.

FIG. 2 illustrates the proposed improvement whereby the hole 3 in the substrate 2 is completely filled with a metal-containing sintering paste 7 or conducting paste, preferably a silver-palladium paste. The sintering paste 7 is at least cohesively bonded to the substrate 2. In addition to this, the sintering paste 7 may also be bonded to the substrate 2 in a form-fitting manner, although this is not illustrated in FIG. 2. This depends on whether the filling of the hole with the sintering paste 7 forms an excess of material or a material plug which engages behind the respective substrate side or the respective hole edge. In addition, the substrate 2 is printed in the region of the completely filled hole 3 on each side with an electrically conductive thick layer 4, 5.

The sintering paste 7, which completely fills the hole 3 here, is a pasty mixture including, for example, at least silver, palladium, a glass, a resin and a thinner. As it passes through a sintering furnace, this sintering paste 7 is solidified and consolidated to form a physically solid and electrically conductive structure. The sintering paste 7 here contains a palladium content of preferably 10% to 15%. The sintering paste 7 here may be lead-containing or lead-free depending on the application.

An advantage of such a metallization of the hole 3 is that sufficient electrically conductive material is present at every point in the hole in order to assure failsafe through-plating of the substrate 2.

In addition, the region X' around the hole 3 required for metallization according to FIG. 2 is smaller by comparison with the region X according to FIG. 1. Therefore, the proposed mode of metallization also leads to saving of space. The region X may be about 600 to 900 µm, and the region X' about 300 µm or less. As a result, the region X' is thus at most half the size of the region X.

The substrates illustrated in FIGS. 1 and 2 each have a thickness of about 0.63 mm. Furthermore, the holes 3 illustrated in FIGS. 1 and 2 each have a conical shape. Such a conical shape arises for production-related reasons when drilling the holes by a laser. The upper hole diameter here may be about 0.1 to 0.3 mm.

Figure 3:
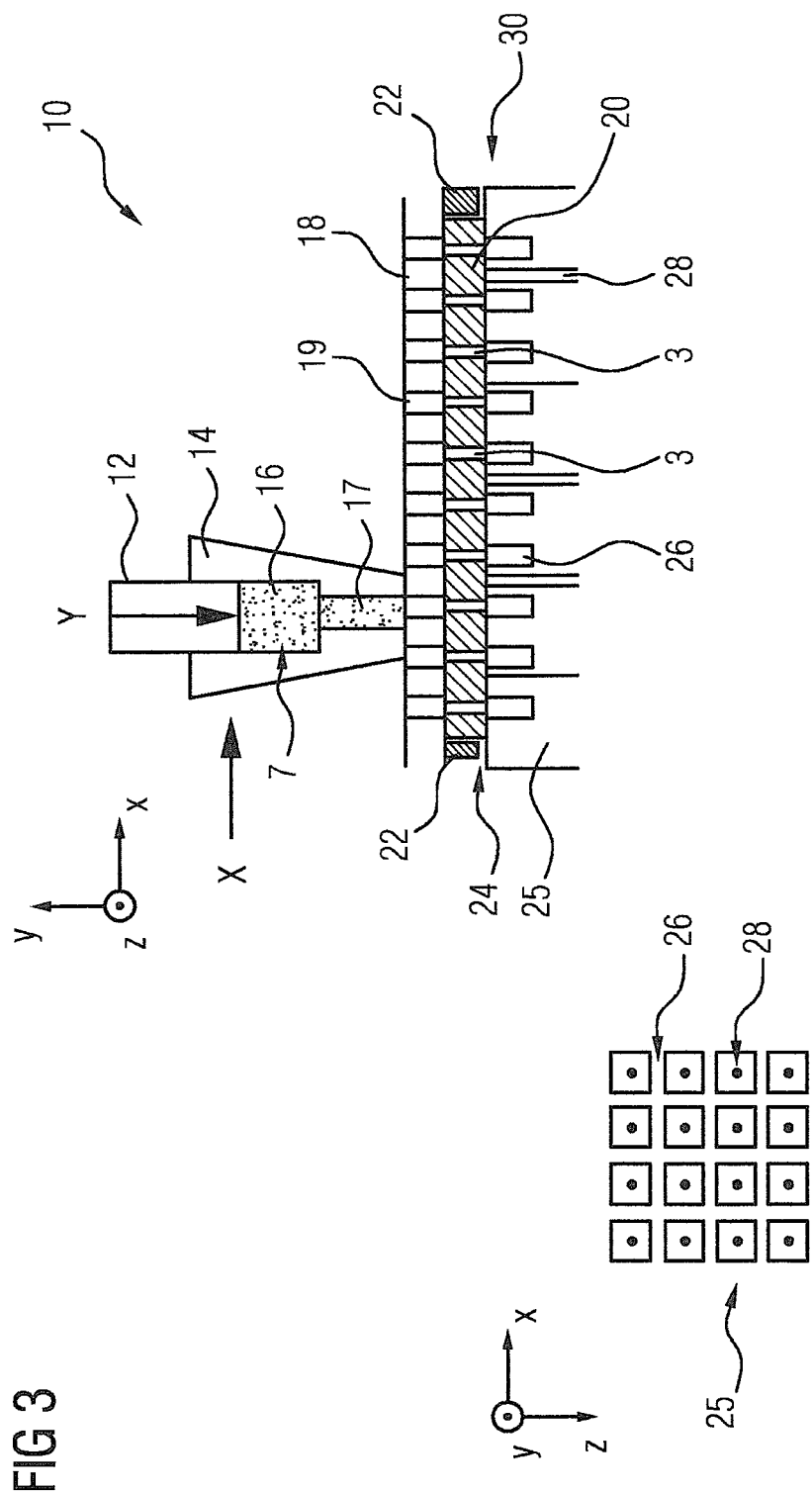
FIG. 3 is a schematic illustration of a compression pressure filling device.

FIG. 3 illustrates an arrangement 30 of a substrate matrix 20 in a compression pressure filling device 10. Such a substrate matrix 20 consequently gives rise to a multitude of substrates 2 (cf. FIG. 2). For example, the substrate matrix 20 may comprise a total of 16 substrates 2, for instance in a 2×8 arrangement, i.e. in an arrangement having two rows each of 8 substrates 2. The compression pressure filling device 10 here enables at least simultaneous filling of the holes 3, arranged in a row, in the substrate matrix 20 with said sintering paste 7. This row of holes extends notionally in vertical direction with respect to the plane of the drawing of FIG. 3.

What is specifically apparent is the substrate matrix 20 disposed on a carrier 25. The substrate matrix 20 here is preferably framed by a reinforcing frame 22 and positioned with respect to the carrier 25 in such a way that the holes 3 of the individual substrates 2 are aligned with channels 26 of the carrier 25 that are arranged at right angles to one another. These channels 26 are additionally arranged at least essentially at right angles to the substrate matrix 20. The channels 26 serve firstly to accommodate slight material excesses that form on the underside of the substrate matrix 20 in the filling of the individual holes 3, and secondly to ventilate the individual holes 3.

As an alternative to these channels 26, the ventilation as such could also be ensured by a porous stone that may be disposed on the carrier 25. Such a porous stone could be in the form, for example, of a rectangular slab and be disposed in a corresponding receptacle of the carrier 25, such that the carrier 25 laterally frames the stone. The face of the stone facing the substrate matrix 20 appropriately concludes flush with the face of the carrier 25 facing the substrate matrix 20 in order to assure correspondingly two-dimensional contact with the substrate matrix 20.

The positionally accurate alignment of the substrate matrix 20 may be assured here, for example, via at least one corresponding stop (not shown) which is formed for instance on the carrier 25 and can be abutted, for example, by the reinforcing frame 22. The carrier 25 further comprises a multitude of vertical suction channels 28 via which the substrate matrix 20 is sucked and hence fixed against the carrier 25 by a negative pressure. The formation of the channels 26 results in formation of individual squares on the side of the carrier 25 facing the substrate matrix 20. Each of these squares is assigned at least one suction channel 28, for example with a central arrangement of the suction channel 28 (cf. FIG. 3).

In the case of the aforementioned porous stone—not shown here—the suction channels 28 may be arranged, for example, on two opposite sides of the stone in the carrier 25, such that they correspondingly flank the stone, in order to bring about the suction of the substrate matrix 20 along two edges of the stone.

Between the substrate matrix 20 and the carrier 25 is appropriately disposed a flexible, air-permeable layer 24, for instance in the form of a paper layer, which catches the sintering paste 7.

Atop the substrate matrix 20 appropriately lies a screen 18 having a plurality of holes 19 aligned with the holes 3 that have to be filled. The thickness of the screen is, for example, 0.03 mm. It may alternatively be up to about 0.1 mm Indicated above the screen 18 is a print squeegee 14, by means of which said row of holes in the substrate matrix 20 is completely filled with the sintering paste 7. This print squeegee 14 comprises a collecting chamber 16 and an adjoining, smaller chamber 17, which can cover said row of holes in the substrate matrix 20.

The filling of the substrate matrix 20 here proceeds as follows:

By a plunger of elongate design, in the form of a sword 12 which is movable in the collecting chamber 16, the sintering paste 7 present in the chamber 16 is forced in vertical direction Y into the holes 3 of the row of holes via the chamber 17 and the screen 18. A compression pressure of about 1 to 4 bar is applied here. In this example, a compression pressure of about 3 bar is applied. The sintering paste 7 is introduced into the holes 3 by metering in such a way that, on the underside of the substrate matrix 20, there is formation of only very minor excesses of material or material plugs that extend into the channel 26 and in so doing locally bend the paper layer 24 without tearing or damaging it. The individual plugs here form a material excess with respect to the underside of the substrate matrix 20 of about 2 to 5 µm.

The print squeegee 14 moves from row of holes to row of holes in horizontal direction X to successively fill the individual rows of holes with the sintering paste 7. Both the screen 18 over which the print squeegee 14 sweeps and the paper layer 24 serve to prevent smearing of the substrate matrix 20.

It is also possible for a slight material excess with respect to the upper side of the substrate matrix 20 to form, with the result that the fillings of the individual holes 3 substantially have the form of a rivet.

Subsequent to the above-described filling operation, the substrate matrix 20 runs through a drying furnace and a sintering furnace. The fillings of the individual holes 3 are solidified and consolidated here to form a physically solid and electrically conductive structure.

In the sintering furnace, the substrate matrix 20 runs through a temperature profile with temperatures of up to 850° C. Here, the fillings of the individual holes 3 experience both a reduction and an oxidation and in so doing enter into at least one integral bond with the ceramic substrate 2. In the fully sintered state, these fillings completely fill the respective holes.

The substrate matrix 20 is finally divided into the individual substrates 2, for instance using corresponding intended breakage sites in the substrate matrix 20 formed between the individual substrates 2.

Figure 4:
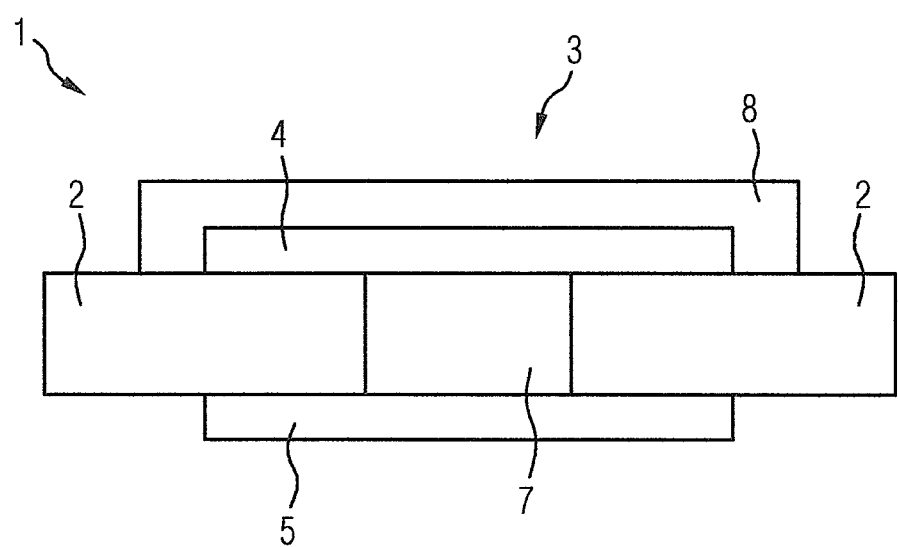
FIG. 4 is a further schematic illustration of a metallization of a substrate hole.

FIG. 4 illustrates a substrate 2 according to the illustration in FIG. 2, but with an illustrated glass layer 8 that covers the electrically conductive thick layer 4. The printed circuit board 1 comprising the substrate 2 (according to FIG. 2 and FIG. 4) forms part of what is called a magnetic passive position sensor, which is used in a fuel tank of a motor vehicle to detect the fuel fill level. Sensors of this type are also referred to as MAPPS (MAgnetic Passive Position Sensor). A sensor of this type contains a printed circuit board, which, on one side of a substrate, is equipped with conductor tracks and a contact spring structure, wherein the contact spring structure is contacted with the conductor tracks by means of a magnet depending on the fuel fill level of the tank. However, the use of such a substrate 2 is not fundamentally reduced to such sensors.

This glass layer 8 contributes to hermetic encapsulation of the opposite side of the substrate 2 equipped with the conductor tracks and the contact spring structure from an aggressive fuel, and hence to protecting it from contamination and corrosion.

In a further configuration, the substrate matrix 20 has a multitude of substrates 2, each having a multitude of holes 3 of different diameter that are to be through-plated. According to the application, such a substrate matrix 20 may be of different size and have, for example, a multitude of substrates 2 or else just two substrates 2, depending on what is called the useful size of the individual substrates 2. Such a substrate matrix 20 may have, for example, up to about 800 holes 3 of different diameters that are to be through-plated, distributed over the individual substrates 2. The individual diameters of the substrate holes 3, 3a, 3b, 3c, 3d, 3e here are, for example, in the range from about 100 to 450 µm.

Figure 5:
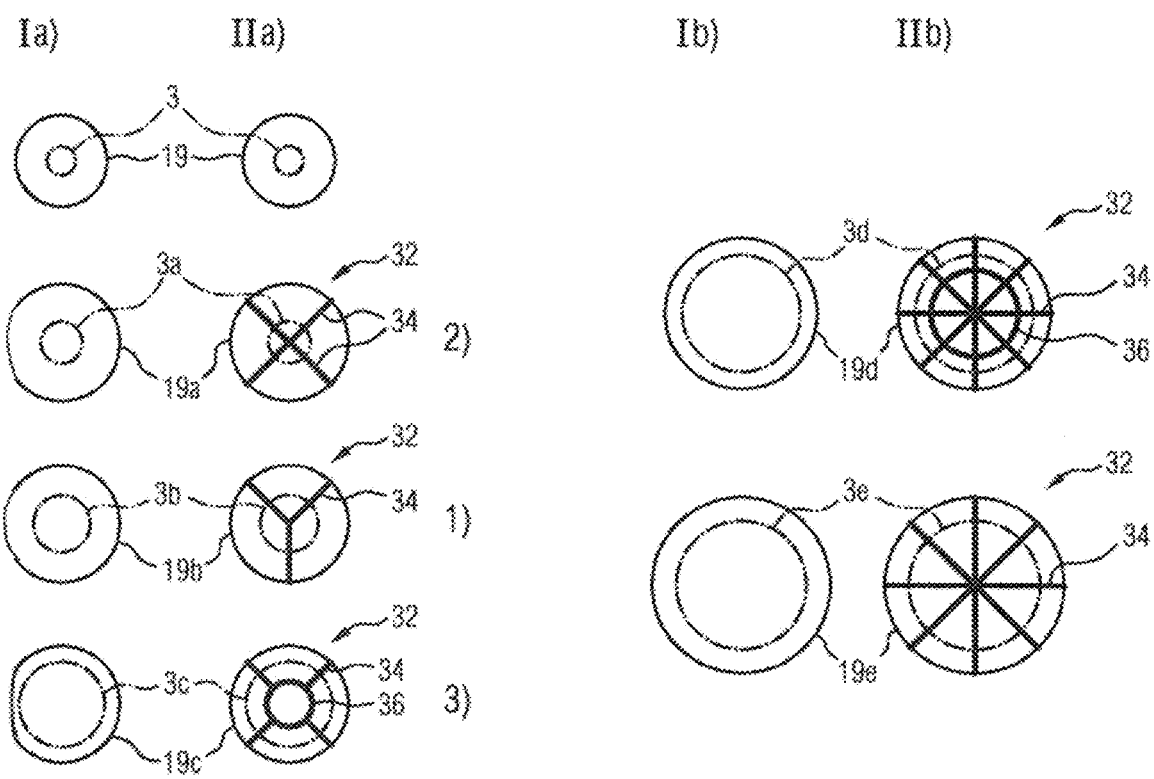
FIG. 5 are screen hole geometries used for filling of substrate holes.

FIG. 5 illustrates different diameters of substrate holes 3, 3a, 3b, 3c, 3d, 3e that may be formed in the individual substrates 2 and are to be filled with the sintering paste 7. Filling of the individual holes 3, 3a, 3b, 3c, 3d, 3e, owing to the different diameters, in principle requires different print parameter sets that would have to be applied in relation to the above-described compression pressure filling method. Such a print parameter set here includes a squeegee fill pressure, also called compression pressure, a squeegee offset pressure and a squeegee speed. For simplification and for avoidance of repetition, reference is made at this point to the definition of these parameters introduced by way of introduction.

Accordingly, processing of the substrate matrix 20 comprising a multitude of substrates 2 with a multitude of holes 3, 3a, 3b, 3c, 3d, 3e in principle requires multiple compression pressure filling operations and hence a multistage compression pressure filling method.

Printing parameters used for different substrate hole diameters are cited by way of example for illustration below. The compression pressure is about 3 bar.

| Substrate hole diameter [µm] | Squeegee offset pressure [N] | Squeegee speed [mm/s] |
| --- | --- | --- |
| 100 | 130 | 20 |
| 150 | 110 | 35 |
| 200 | 100 | 60 |
| 300 | 100 | 60 |

The first two diameters of 100 µm and 150 µm each relate to a signal wire for transmission of a current of, for example, about 10 A. The other two diameters of 200 µm and 300 µm each relate to a power supply wire for transmission of a current of, for example, about 65 to 110 A, for instance in conjunction with a power supply of a motor driver.

What is apparent here is that the squeegee offset pressure is at its highest at the smallest diameter of 100 µm, and that the squeegee speed, by contrast, is at its lowest.

For simplification of the compression pressure filling method, what is now proposed is the use merely of a single print parameter set which is ideally fixed on the basis of the smallest hole 3 to be filled with the smallest hole diameter.

The other screen holes 19a, 19b, 19c, 19d, 19e that are larger than the smallest screen hole are provided here with an area-reducing and area-dividing geometry 32 that divides the assigned screen hole 19a, 19b, 19c, 19d, 19e into multiple hole sections in order to fill the respectively assigned substrate holes 3a, 3b, 3c, 3d, 3e with the print parameters fixed for the smallest substrate hole 3 (see the table above) with the sintering paste 7.

Columns Ia) and Ib) of FIG. 5 show the substrate holes 3, 3a, 3b, 3c, 3d, 3e to be filled and the assigned screen holes 19, 19a, 19b, 19c, 19d, 19e, without said area-reducing and area-dividing geometry 32. Columns IIa) and IIb), by contrast, illustrate individual configurations of area-reducing and area-dividing geometries 32, specifically in relation to the screen holes 19a, 19b, 19c, 19d, 19e.

In a first configuration, a geometry 32 that divides the screen hole 19b into three hole sections is used for the assigned screen hole 19b. Specifically, three identical screen sections 34 in the form of lands arranged offset from one another by 120° are used here for the geometry 32, and these meet in the center of the screen hole 19b, being formed onto one another at the center of the screen hole 19b.

In a second configuration, a geometry 32 that divides the screen hole 19a into four hole sections is used for the assigned screen hole 19a. Specifically, four identical screen sections 34 in the form of lands arranged offset from one another by 90° are used here for the geometry 32, and these meet in the center of the screen hole 19a, being formed onto one another at the center of the screen hole 19a.

In a third configuration, a geometry 32 that divides the screen hole 19c into five hole sections is used for the assigned screen hole 19c. Specifically, one annular screen section 36 and four identical screen sections 34 in the form of lands arranged offset from one another by 90° are used for the geometry 32, and these are formed onto the annular screen section 36 on the outer radius.

In a fourth configuration, a geometry 32 that divides the screen hole 19e into eight hole sections is used for the assigned screen hole 19e. Specifically, eight identical screen sections 34 in the form of lands arranged offset from one another by 45° are used here for the geometry 32, and these meet in the center of the screen hole 19e, being formed onto one another at the center of the screen hole 19e.

In a fifth configuration, a geometry 32 that divides the screen hole 19d into sixteen hole sections is used for the assigned screen hole 19d. Specifically, one annular screen section 36 and eight identical screen sections 36 in the form of lands arranged offset from one another by 45° are used here for the geometry 32, and these meet in the center of the screen hole 19d, being formed onto one another at the center of the screen hole 19d. The screen sections 36 here intersect the annular screen section 34.

In one embodiment, the screen 18 illustrated in FIG. 3—which may have been manufactured, for example, from a steel in a laser cutting method and may have a screen thickness of 30 to 150 μm—comprises at least one of the above-described screen holes 19a, 19b, 19c, 19d, 19e. Furthermore, the screen 18 may, additionally or alternatively to the above-described screen holes 19a, 19b, 19c, 19d, 19e, comprise further screen holes having different area-reducing and area-dividing geometries.

The sole print parameter set may be fixed here for hole diameters of, for example, about 100 to 450 μm. For the assigned screen hole 19, 19a, 19b, 19c, 19d, 19e, it is possible here, without taking account of the area-reducing and area-dividing geometry 32, to fix a hole diameter of, for example, about 300 to 600 μm.

The use of a printing screen of the type described above simplifies a filling manufacturing operation in which a multitude of substrate holes having at least two hole diameters are to be filled, in that all holes to be filled are filled simultaneously with a sintering paste, ideally in a single filling manufacturing operation using merely a single print parameter set. The print parameter set used is ideally based here on the substrate hole having the smallest diameter. Thus, in the ideal case, there will be just one pass through a drying and sintering furnace for drying and firing of the sintering paste introduced into the individual substrate holes. But it is at least possible to reduce the number of thermal treatment operations to a minimum.

The use of such a printing screen is thus the best possible way of counteracting the formation of what are called depletion zones especially in the sintering paste owing, for example, to migration of metal or glass—on account of the aforementioned Kirkendall effect—and hence the formation of holes in the material. Such depletion zones are promoted specifically by multiple passes through a sintering furnace.

For the sake of completeness, it should be mentioned by way of illustration at this point that it has been possible to date for such printed circuit boards to pass through a sintering furnace for thermal treatment up to about fifteen times. The proposed printing screen thus advantageously contributes to reducing this number of passes through the sintering furnace to a minimum.

Although exemplary embodiments have been elucidated in the above description, it should be noted that numerous modifications are possible. Furthermore, it should be noted that the exemplary embodiments are merely examples which are not intended to limit the scope of protection, the applications and the structure in any way. Instead, the above description gives the person skilled in the art a guideline for the implementation of at least one exemplary embodiment, wherein various changes may be made, especially with regard to the function and arrangement of the component parts described, without departing from the scope of protection as apparent from the claims and combinations of features equivalent thereto.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method of through-plating a printed circuit board with conductor tracks formed on two sides of a sintered ceramic substrate, comprising:

simultaneously filling a multitude of holes of different hole diameter in the sintered ceramic substrate under compression pressure with a metallic sintering paste in a single filling manufacturing operation;

drying and firing and sintering the metallic sintering paste in a course of the firing, wherein the metallic sintering paste in its sintered state enters into at least a cohesive bond with the sintered ceramic substrate and fills the hole;

wherein, for the simultaneous filling of the multitude of holes of different hole diameter with the metallic sintering paste, a printing screen having a multitude of assigned screen holes of different diameter is used; and using a single set of print parameters fixed based on one hole among those to be filled that functions as a reference;

wherein the printing screen comprises at least one screen hole for filling a hole which is larger compared to a reference hole; and wherein the at least one screen hole has an area-reducing and area-dividing geometry that divides the at least one screen hole into at least two hole sections.

2. The method as claimed in claim 1, wherein the reference hole in the sintered ceramic substrate defined for fixing the single set of print parameters is a hole having a smallest diameter.

3. The method as claimed in claim 1, wherein all holes in the sintered ceramic substrate that are to be filled are filled simultaneously in a single filling manufacturing operation.

4. The method as claimed in claim 1, wherein a geometry that divides the screen hole into three hole sections is used for the screen hole.

5. The method as claimed in claim 4, wherein three identical screen sections configured as lands arranged offset from one another by 120° are used for the geometry and meet in a center of the screen hole, being formed onto one another at the center of the screen hole.

6. The method as claimed in claim 1, wherein a geometry that divides the screen hole into four hole sections is used for an assigned screen hole.

7. The method as claimed in claim 6, wherein four identical screen sections configured as lands arranged offset from one another by 90° are used for the geometry and meet in a center of the screen hole, being formed onto one another at the center of the screen hole.

8. The method as claimed in claim 1, wherein a geometry that divides the screen hole into five hole sections is used for an assigned screen hole.

9. The method as claimed in claim 8, wherein one annular screen section and four identical screen sections configured as lands arranged offset from one another by 90° are used for the geometry and are formed onto the one annular screen section on an outer radius.

10. The method as claimed in claim 1, wherein a geometry that divides the screen hole into eight hole sections is used for an assigned screen hole.

11. The method as claimed in claim 10, wherein eight identical screen sections configured as lands arranged offset from one another by 45° are used for the geometry and meet in a center of the screen hole, being formed onto one another at the center of the screen hole.

12. The method as claimed in claim 1, wherein a geometry that divides the screen hole into sixteen hole sections is used for an assigned screen hole.

13. The method as claimed in claim 12, wherein one annular screen section and eight identical screen sections configured as lands arranged offset from one another by 45° are used for the geometry and meet in a center of the screen hole, being formed onto one another at the center of the screen hole and intersecting with the one annular screen section.

14. The method as claimed in claim 1, wherein the printing screen has at least one row of holes having at least one screen hole with an area-reducing and area-dividing geometry.

15. The method as claimed in claim 1, wherein the single set of print parameters is defined for hole diameters of 100 to 450 µm.

16. The method as claimed in claim 1, wherein a hole diameter of 300 to 600 µm is fixed for an assigned screen hole without taking account of the area-reducing and area-dividing geometry.

17. The method as claimed in claim 1, wherein a screen thickness of 30 to 150 µm is used for the printing screen.

18. A printed circuit board comprising
a sintered ceramic substrate;
conductor tracks formed on two sides of the sintered ceramic substrate;
wherein the sintered ceramic substrate which, in a fully sintered state, has at least through-plated two holes through-plated by:
simultaneously filling a multitude of holes of different hole diameter in the sintered ceramic substrate under compression pressure with a metallic sintering paste in a single filling manufacturing operation;
drying and firing and sintering the metallic sintering paste in a course of the firing, wherein the metallic sintering paste in its sintered state enters into at least a cohesive bond with the sintered ceramic substrate and fills the hole;
wherein, for the simultaneous filling of the multitude of holes of different hole diameter with the metallic sintering paste, a printing screen having a multitude of assigned screen holes of different diameter is used; and
using a single set of print parameters fixed based on one hole among those to be filled that functions as a reference;
wherein the printing screen comprises at least one screen hole for filling a hole which is larger compared to a reference hole, and
wherein the at least one screen hole has an area-reducing and area-dividing geometry that divides the at least one screen hole into at least two hole sections.

* * * * *